United States Patent
Ohuchi et al.

(10) Patent No.: US 6,344,372 B1
(45) Date of Patent: Feb. 5, 2002

(54) SEMICONDUCTOR DEVICE WITH RELIABLE CONNECTION BETWEEN PROJECTIVE ELECTRODE AND CONDUCTIVE WIRE OF THE SUBSTRATE

(75) Inventors: Rieka Ohuchi; Takatoshi Suzuki, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/521,890

(22) Filed: Mar. 9, 2000

Related U.S. Application Data (62) Division of application No. 09/179,557, filed on Oct. 27, 1998, now Pat. No. 6,197,617.

(30) Foreign Application Priority Data

Oct. 28, 1997 (JP) .............................................. 9-311116

(51) Int. Cl.[7] ......................... H01L 21/44; H01L 21/48; H01L 21/50
(52) U.S. Cl. ....................... 438/106; 438/106; 438/118; 438/121; 438/123; 438/125; 438/455; 438/457; 438/459; 257/678
(58) Field of Search .................................. 438/106, 118, 438/119–23, 125–27, 455–459; 257/678

(56) References Cited

U.S. PATENT DOCUMENTS

| 6,100,112 A | * | 10/1998 | Amano et al. | 438/106 |
|---|---|---|---|---|
| 6,263,649 B1 | * | 2/1999 | Yoshino | 438/118 |
| 5,926,694 A | * | 7/1999 | Chigawa et al. | 438/106 |
| 5,930,599 A | * | 7/1999 | Fugimoto et al. | 438/113 |
| 5,937,277 A | * | 8/1999 | Matsuda et al. | 438/119 |
| 6,214,649 B1 | * | 8/1999 | Ishida | 438/126 |
| 6,046,071 A | * | 4/2000 | Sawai et al. | 438/106 |
| 6,184,066 B1 | * | 2/2001 | Chino et al. | 438/118 |

FOREIGN PATENT DOCUMENTS

JP 6-105727 12/1994

OTHER PUBLICATIONS

Takahashi et al. "Numerical analysis of fine lead bonding-—Effect of pad thickness on deformation" IEEE trans on components and packaging tech. vol. 22 No. 2 Jun. 1999 p. 291–298.*

* cited by examiner

*Primary Examiner*—Matthew Smith
*Assistant Examiner*—Granville D Lee
(74) *Attorney, Agent, or Firm*—Whitham, Curtis & Christofferson, P.C.

(57) ABSTRACT

In a semiconductor device including a substrate which has a primary surface, a conduction wire formed on the primary surface, a semiconductor element which has a secondary surface, a projective electrode formed on the secondary surface, an insulative resin for adhesion which is applied between the primary surface and the secondary surface and which shrinks by hardening thereof, the substrate and the semiconductor element are adhered to each other by the hardening of the insulative resin with the projective electrode and the conduction wire corresponding with each other, so that an electrical connection between the projective electrode and the conduction wire is achieved and that a residual stress is generated in the insulative resin. The residual stress has a maximum value thereof around the projective electrode.

8 Claims, 5 Drawing Sheets

SEMICONDUCTOR DEVICE WITH RELIABLE CONNECTION BETWEEN PROJECTIVE ELECTRODE AND CONDUCTIVE WIRE OF THE SUBSTRATE

This is a divisional application of co-pending application Ser. No. 09/179,557 filed on Oct. 27, 1998, now U.S. Pat. No. 6,197,617.

BACKGROUND OF THE INVENTION

This invention relates to a semiconductor device and a method of manufacturing the semiconductor device, particularly to the semiconductor device having an improved packaging structure of IC (Integrated Circuit). LSI (Large Scale Integration), and the like, which have plenty of terminals and conductive wires arranged in narrow pitch fashion, and the method of manufacturing such a semiconductor device.

Conventionally, a method using shrinkage power of a heat-hardened resin has been employed to connect a plurality of projective electrodes of a semiconductor element after sealing with conductive wires on a substrate. An example of the method is exemplified, as a prior art, in Japanese Patent Publication No.Hei 6-105727, namely, 105727/1994. As will later be described more in detail, a semiconductor device fabricated by the use of the conventional method has a structure in which hardenning and shrinking power of an insulative resin is larger than a thermal stress of the insulative resin at a desirable temperature.

However, the shrinking power of the insulative resin for fixing the semiconductor element to the substrate is generated uniformly over a connected area between the semiconductor element and the substrate. The shrinking power of the insulative resin is larger at a high temperature than at an ordinary temperature. A difference of the shrinking power therebetween is generated, as a thermal stress, repeatedly on the insulative resin every time heat is generated and dissipated by the semiconductor device on use. The thermal stress makes the insulative resin fatigued and accelerates a deterioration thereof so that the shrinkage power of the insulative resin is decreased. As a result, a quantity of expansion of the insulative resin comes to exceed a quantity of shrinkage thereof. Consequently, voids are generated between a projective electrode of the semiconductor element and a conductive wire of the substrate. Accordingly, a defective conduction is inevitably caused to occur between the projective electrode and the conductive wire.

SUMMARY OF THE INVENTION

It is therefore an object of the present invention to provide a semiconductor device which is capable of preventing a conduction between a projective electrode of the semiconductor element and a conductive wire of the substrate from becoming defective by a thermal stress generated on an insulative resin.

It is another object of the present invention to provide a method of manufacturing the semiconductor device, in which a semiconductor device is readily manufactured at a comparatively low cost with high reliability of connection between a projective electrode of a semiconductor element and a conductive wire of a substrate.

Other objects of the present invention will become clear as the description proceeds.

According to an aspect of the present invention, there is provided a semiconductor device comprising: a substrate which has a primary surface; a conduction wire formed on the primary surface; a semiconductor element which has a secondary surface; a projective electrode formed on the secondary surface; an insulative resin for adhesion which is applied between the primary surface and the secondary surface and which shrinks by hardening thereof; the substrate and the semiconductor element being adhered to each other by the hardening of the insulative resin with the projective electrode and the conduction wire corresponding with each other, so that an electrical connection between the projective electrode and the conduction wire is achieved and that a residual stress is generated in the insulative resin; and the residual stress having a maximum value thereof around the projective electrode.

The residual stress may further have a minimum value thereof around a central portion of the semiconductor element, wherein the electrical connection is kept by a tensile power based on the residual stress around the projective electrode.

The minimum value may be null.

A primary part of the substrate inside of the conduction wire corresponding to the projective electrode may be thinner than a secondary part of the substrate outside of the conduction wire corresponding to the projective electrode.

A secondary portion may comprise multiple layers while the primary portion comprises at least one layer fewer than the multiple layers of the secondary portion, so that the substrate has flexibility.

The substrate may include an organic substrate.

The insulative resin for adhesion may be a heat-hardened type.

According to another aspect of the present invention, there is provided a method of manufacturing a semiconductor device including a substrate having a primary surface, a semiconductor element having a secondary surface, and a plurality of projective electrodes formed on the secondary surface, the method comprising the steps of: applying a heat-hardened insulative resin to a predetermined position of the primary surface of the substrate having the plurality of conduction wires; bringing the secondary surface of the semiconductor element heated up to a first temperature not lower than 80° C. into contact with the primary surface of the substrate heated up to a second temperature not lower than 50° C. with the plurality of projective electrodes being positioned to the plurality of conduction wires, respectively; pressing the semiconductor element on the substrate to push the plurality of projective electrodes onto the plurality of conduction wires, respectively, each of the plurality of projective electrodes being deformed while each of the plurality of conduction wires sinking into the substrate from the primary surface; and continuously heating at least the semiconductor element to make the heat-hardened insulative resin be hardened to shrink, so that a part of the substrate under the semiconductor element is pulled up towards the semiconductor element.

A residual stress generated when the heat-hardened insulative resin is hardened to shrink may have a maximum value thereof around the projective electrode and a minimum value thereof around a central portion of the semiconductor element, an electrical connection between each of the plurality of projective electrodes and each of the plurality of conduction wires being kept by a tensile power based on the residual stress around the projective electrode.

The minimum value may be null.

A primary part of the substrate inside of the conduction wire corresponding to the projective electrode may be thinner than a secondary part of the substrate outside of the conduction wire corresponding to the projective electrode.

The secondary portion may comprise multiple layers while the primary portion comprises at least one layer fewer than the multiple layers of the secondary portion so that the substrate has flexibility.

BRIEF DESCRIPTION OF THE DRAWINGS

FIGS. 2A and 2B are schematic side views for showing a structure of the conventional semiconductor device illustrated in FIGS. 1A to 1D, in which FIG. 2A shows the structure thereof at an ordinary temperature while FIG. 2B shows the structure thereof at a high temperature;

FIG. 5A and 5B are schematic side views for showing a structure of a semiconductor device according to a preferred embodiment of the present invention, in which FIG. 5A shows the structure thereof at an ordinary temperature while FIG. 5B shows the structure thereof at a high temperature;

DETAILED DESCRIPTION OF THE PREFERRED EMBODIMENTS

Referring to FIGS. 1A to 1D, 2A, 2B and 3, a description is provided regarding a conventional semiconductor device and a method of manufacturing the semiconductor device in order to facilitate an understanding of the present invention.

FIGS. 1A to 1D are schematic side views for showing a method of manufacturing the conventional semiconductor device with various manufacturing steps.

Figure 1A:
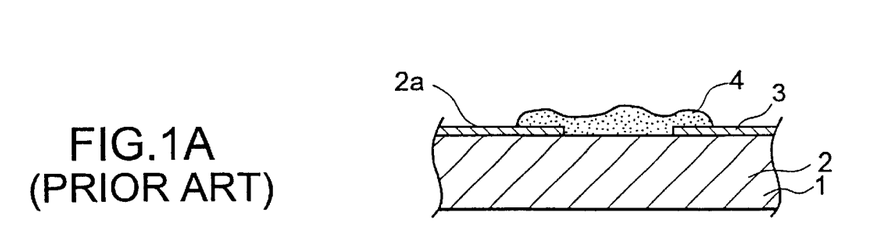
FIGS. 1A to 1D are schematic side views for showing a method of manufacturing a conventional semiconductor device with various manufacturing steps.

First, a wiring substrate 1 consisting of ceramics, glass, glassepoxy, or the like is prepared in a known manner. The wiring substrate 1 includes a base member 2 which has a principal surface 2a directed upward in FIG. 1A. Conduction wires 3 (in FIG. 1A, conduction pads formed on ends of the conduction wires are shown) are formed on the principal surface 2a. An insulative resin 4 for adhesion is spread on the principal surface 2a as illustrated in FIG. 1A. The conduction wires (or conduction pads) 3 are composed of Cr-Au, Al, Cu, ITO, or the like. In order to form the conduction wires (or conduction pads) 3, at first, wiring metals are formed on the wiring substrate 1 by the use of sputtering or vapor deposition. Thereafter, the wiring substrate 1 is subjected to a photoresist process to form a resist remained in line with desirable patterns. Using the remained resist as an etching mask, the wiring metals are etched to form the conduction wires (or conduction pads) 3. The remained resist is then removed to make the conduction wires (or conduction pads) 3 exposed. Alternatively, the conduction wires (or conduction pads) 3 can be formed by a printing method. The insulative resin 4 is made of a resin, such as epoxy, silicon, acril, or the like, each of which is a heat-hardened type.

Figure 1B:
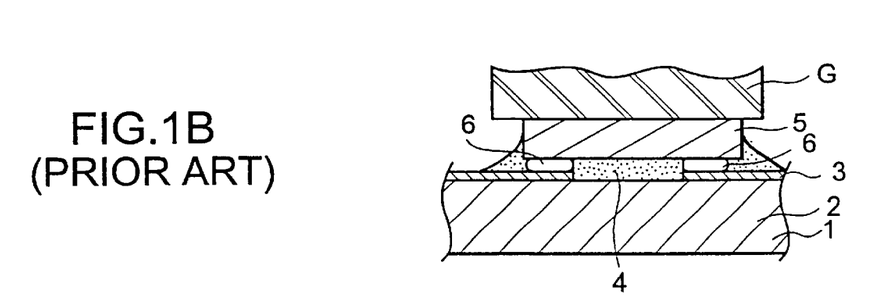
Figure 1C:
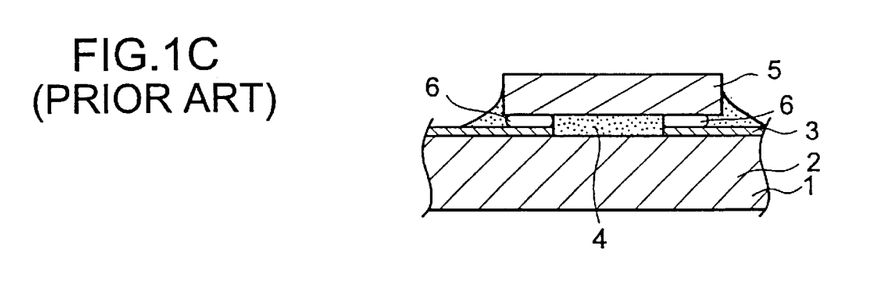
Figure 1D:
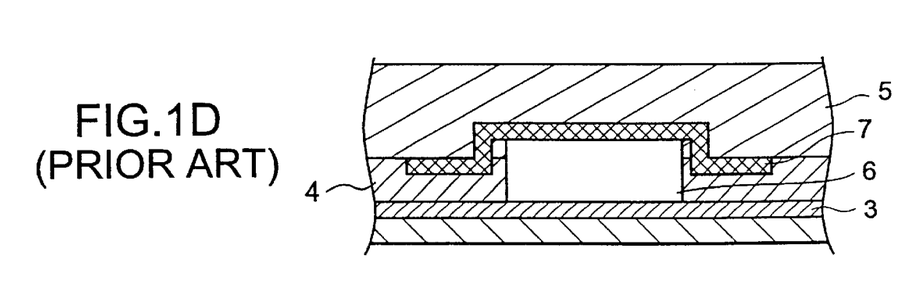

Second, as illustrated in FIGS. 1B and 1C, projective electrodes 6 of a semiconductor element 5 are positioned to face the conduction wires (or conduction pads) 3 correspondingly to each other. Herein, the projective electrodes 6 are composed of Au, Ag, or Cu, and are formed on an aluminum electrode 7 of the semiconductor element 5 by electric plating, or the like. The semiconductor element 5 is then pressed by an implement G to be pushed onto the base member 2 of the wiring substrate 1. A condition around the projective electrodes 6 at this stage is shown in FIG. 1D. Namely, when the projective electrodes 6 are pushed onto the base member 2 (the cross-hatched area just below the conduction wires (or conduction pads)), the insulative resin 4 for adhesion is pushed and exploded out of a space between the projective electrodes 6 and the conduction wires (or conduction pads) 3 to form a filet. Thereby, the projective electrodes 6 and the conduction wires (or conduction pads) 3 are electrically connected to each other.

Third, under the condition mentioned above, the insulative resin 4 for adhesion is heated to be hardened. Thereafter, the semiconductor element 5 is released from the pressure by the implement G and fixed to the wiring substrate 1. Accordingly, the projective electrodes 6 of the semiconductor element 5 and the conduction wires (or conduction pads) 3 of the wiring substrate 1 are kept to be electrically connected to each other by shrinkage power of the insulative resin 4 for adhesion of a heat-hardened type.

Thus, in the conventional semiconductor device and the method of manufacturing the conventional semiconductor device, the semiconductor element 5 and the wiring substrate 1 are adhered to each other by the insulative resin 4 of a heat-hardened type. Further, an electrical connection between the projective electrodes 6 and the conduction wires (or conduction pads) 3 is achieved by the shrinkage power of the insulative resin 4.

Figures 2A, 2B:
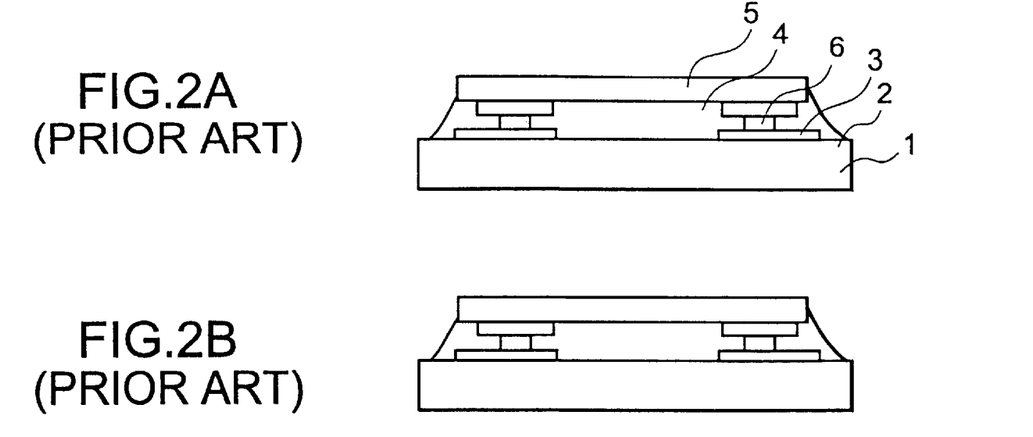

In the interim, as depicted in Japanese Patent Publication No.Hei 6-105727, namely, 105727/1994 and mentioned in the preamble of the instant specification, the conventional semiconductor device has a structure in which hardenning and shrinking power of the insulative resin 4 is larger than a thermal stress of the insulative resin 4 at a desirable temperature. FIGS. 2A and 2B are schematic side views for showing a structure of the conventional semiconductor device, in which FIG. 2A shows the structure thereof at an ordinary temperature while FIG. 2B shows the structure thereof at a high temperature.

Figure 3:
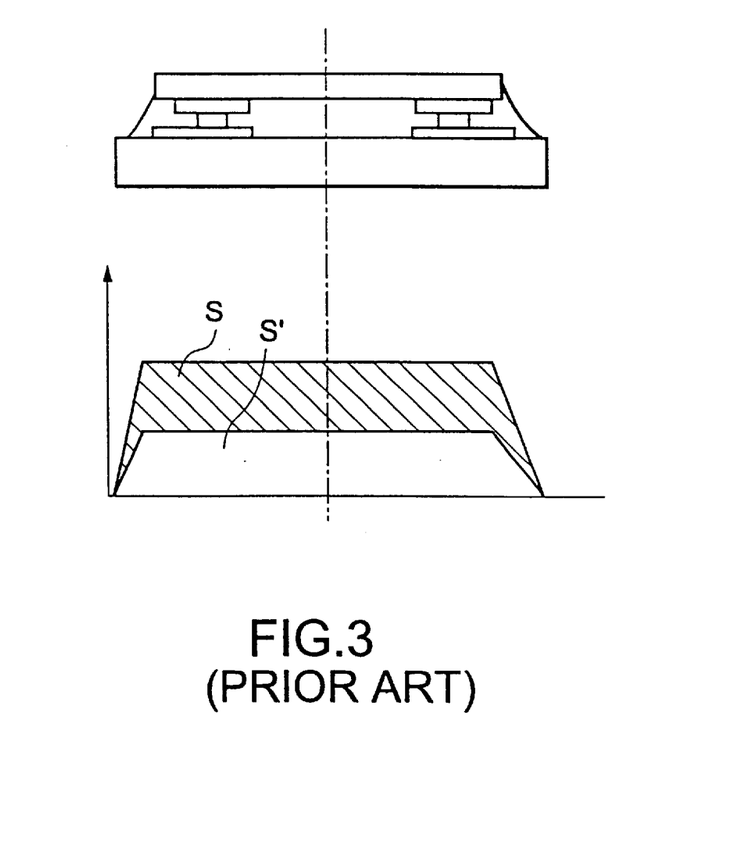
FIG. 3 is a conceptional view for explaining a manner in which residual stress remains in the conventional semiconductor device illustrated in FIGS. 1A to 1D.

However, the shrinking power of the insulative resin 4 is generated uniformly over a connected area between the semiconductor element 5 and the wiring substrate 1. The shrinking power of the insulative resin 4 is larger at a high temperature than at an ordinary temperature. Namely, as shown in FIG. 3., the shrinking power of the insulative resin 4 is distributed over a region "S" at an ordinary temperature while the shrinking power of the insulative resin 4 is distributed over a region "S" at a high temperature. A difference "s" of the shrinking power therebetween is generated, as a thermal stress, repeatedly on the insulative resin 4 every time heat is generated and dissipated upon use by a fabricated semiconductor device consisting of the semiconductor element 5 and the wiring substrate 1. The thermal stress makes the insulative resin 4 fatigued and accelerates a deterioration thereof so that the shrinkage power of the insulative resin 4 is decreased. As a result, a quantity of expansion of the insulative resin 4 comes to exceed a quantity of shrinkage thereof. Consequently, voids are generated between the projective electrodes 6 and the conduction wires (or conduction pads) 3. Accordingly, a defective conduction is inevitably caused to occur between the projective electrodes 6 and the conduction wires (or conduction pads) 3.

Figure 5A:
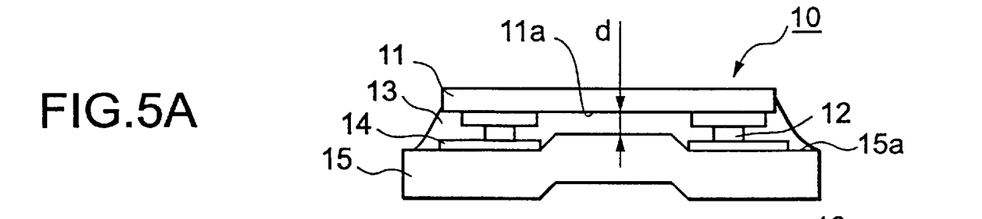
Figure 5B:
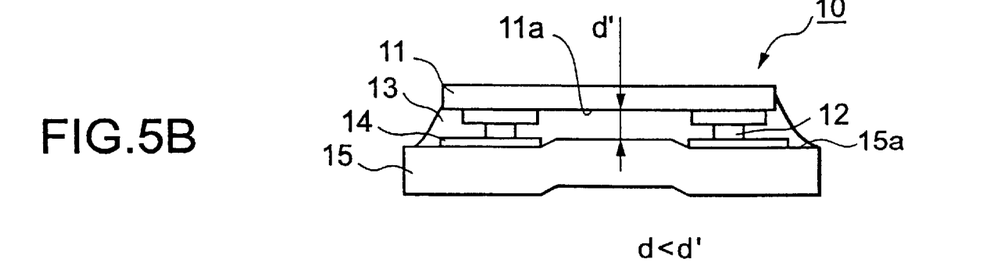

Herein, before proceeding to a semiconductor device and a method of manufacturing the semiconductor device according to a preferred embodiment of the present invention, description is made as regards a principle of the present invention, referring to FIG. 5.

The present invention can resolve the above-mentioned essential problem, that is, the defective conduction due to deterioration of the shrinkage power of the insulative resin, in a method for adhering the semiconductor element and the wiring substrate to each other by the insulative resin of a heat-hardened type and further for electrically connecting the projective electrodes and the conduction wires to each other by the shrinkage power of the insulative resin. For this purpose, in the present invention, a residual stress of the insulative resin is generated to have a maximum value thereof near the projective electrodes of the semiconductor element. On the contrary, the residual stress of the insulative resin is also generated to have a minimum value or almost null value thereof near a central portion of the semiconductor element.

The semiconductor element is heated up to approximately 200° C. and adhered to the wiring substrate through the insulative resin. The insulative resin is hardened by the heat of the semiconductor element. Then, the semiconductor element is recovered down to an ordinary temperature. As a result, the semiconductor element and the wiring substrate are pulled closely to each other by hardened shrinkage and thermal shrinkage of the insulative resin. The projective electrodes of the semiconductor element are made of gold or solder. A quantity of thermal shrinkage of the projective electrodes is so far less than that of the insulative resin. The projective electrodes prevent the insulative resin between the semiconductor element and the wiring substrate from sufficiently shrinking near the projective electrodes. As a result, a tensile stress is generated, as a residual stress, in the insulative resin near each of the projective electrodes while a compressive stress is generated, as a residual stress, between each of the projective electrodes and each of the conduction wires. By existence of the compressive stress, the electrical connection between each of the projective electrodes and each of the conduction wires can be effectively kept.

Figure 4:
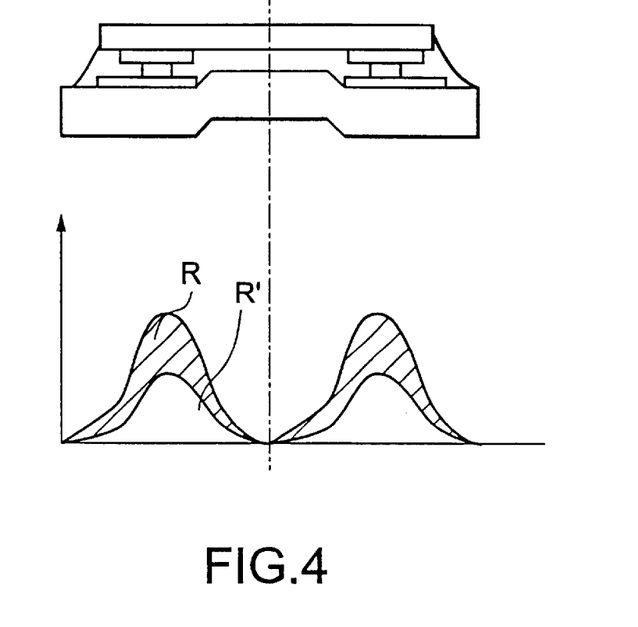
FIG. 4 is a conceptional view for explaining a manner in which residual stress remains in the semiconductor device according to the preferred embodiment of the present invention.

On the other hand, let the insulative resin shrink sufficiently near the central portion of the semiconductor element so that the residual stress have a minimum value thereof in the present invention. FIG. 4 is a conceptional view for explaining a manner in which residual stress remains in a semiconductor device according to the present invention. Namely, as shown in FIG. 4, the residual stress within the insulative resin is distributed over a region "R" at an ordinary temperature while the residual stress within the insulative resin is distributed over a region "R" at a high temperature. A difference "r" of the residual stress is generated, as a thermal stress, repeatedly on the insulative resin every time heat is generated and dissipated upon use by a fabricated semiconductor device consisting of the semiconductor element and the wiring substrate. As will clearly be understood by comparing FIG. 4 with FIG. 3, an amount of the thermal stress in the present invention is less than that in the above-mentioned prior art. Consequently, in the present invention, it takes longer than the prior art to make the insulative resin fatigued and to accelerate a deterioration thereof so that the shrinkage power of the insulative resin is decreased.

Referring now to FIGS. 5A, 5B, and 6A to 6D with reference to FIG. 4 continued, description will proceed to a semiconductor device and a method of manufacturing the semiconductor device according to a preferred embodiment of the present invention.

FIGS. 5A and 5B are schematic side views for showing a structure of a semiconductor device according to the embodiment of the present invention, in which FIG. 5A shows the structure thereof at an ordinary temperature while FIG. 5B shows the structure thereof at a high temperature.

As illustrated in FIGS. 5A and 5B, a semiconductor device 10 according to the preferred embodiment comprises a substrate 15 having a principal surface 15a directed upward to FIGS. 5A and 5B, conduction wires (or conduction pads) 14 formed on the principal surface 15a, a semiconductor element 11 having a bottom surface 11a directed downward of FIGS. 5A and 5B, projective electrodes 12 formed on the bottom surface 11a and an insulative resin 13 for adhesion of a heat-hardened type. The projective electrodes 12 are positioned to correspond with the conduction wires (or conduction pads) 14. The substrate 15 and the semiconductor element 11 are adhered to be fastened to each other by the insulative resin 13 for adhesion of a heat-hardened type.

In the semiconductor device 10 having the above structure, a residual stress generated by hardening of the insulative resin 13 has a maximum value thereof near the projective electrodes 12 while that residual stress has a minimum value or almost null thereof near a central portion of the semiconductor element 11. Further, an electrical connection between the conduction wires (or conduction pads) 14 and the projective electrodes 12 is kept by a tensile power based on the residual stress near the projective electrodes 12. Accordingly, a thickness "d" of the insulative resin 13 near (around) the central portion of the semiconductor element 11 at an ordinary temperature is smaller than a thickness "d" thereof when the semiconductor element 11 is heated.

Referring to FIGS. 6A to 6D, a description proceeds to a method of manufacturing the semiconductor device according to the preferred embodiment of the present invention. FIGS. 6A to 6D are schematic side views of showing sequential steps of positioning each of a plurality of projective electrodes 12 to the conduction wires (or conduction pads) 14 and connecting them to each other.

Figure 6A:
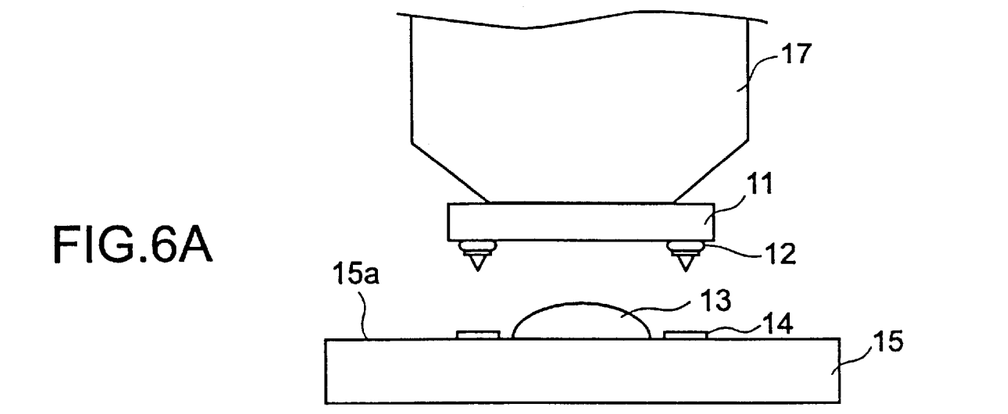
FIGS. 6A and 6D are schematic side views for showing first and second examples of a method a manufacturing the semiconductor device according to the preferred embodiment of the present invention with various manufacturing steps.
Figure 6B:
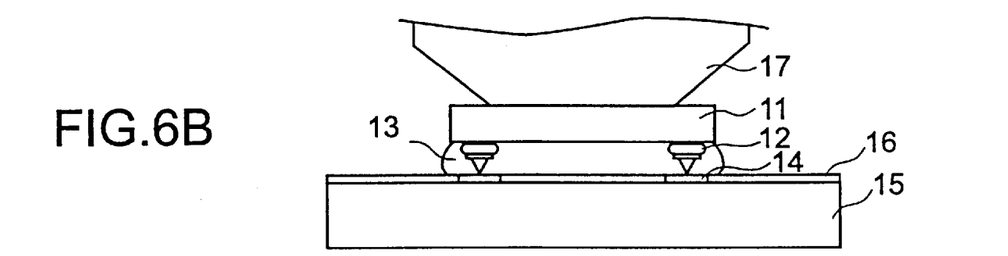

First, the wiring substrate 15 consisting of glassepoxy, polyimide, or the like is prepared in a known manner. The wiring substrate 15 has a principal surface 15a directed upward to FIGS. 6A to 6D. Conduction wires 14 (in FIGS. 6A to 6D, conduction pads formed on ends of the conduction wires are shown) are formed on the principal surface 15a. An insulative resin 13 for adhesion is spread on the principal surface 15a, as illustrated in FIG. 6A. The insulative resin 13 is composed of epoxy, silicon, acrylic, or the like, each of which is a heat-hardened type. The projective electrodes 12 and the conduction wires (or conduction pads) 14 are formed similarly to the above-mentioned elements of the conventional semiconductor device. Each of the projective electrodes 12 is made of Au, Ag, or Cu. As illustrated in FIG. 6B each of the projective electrodes 12 is positioned to face the respective conduction wires (or conduction pads) 14 to be kept in contact with each other. At this time, the semiconductor element 11 is heated by a heating implement (heat source) 17 up to 150° C. through 230° C. while the wiring substrate 15 is heated up to 50° C. through 100° C.

Figure 6C:
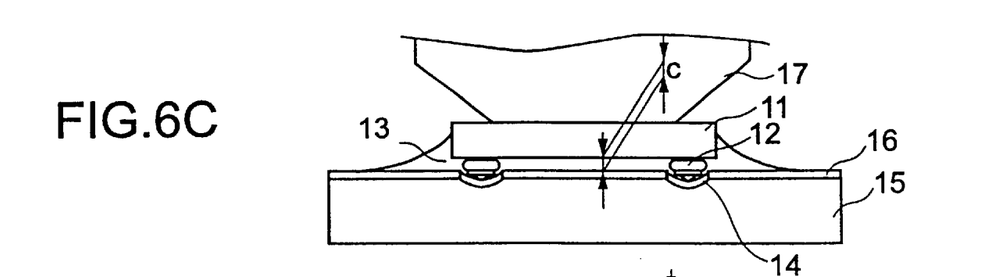

Next, as illustrated in FIG. 6C, the semiconductor element 11 is then pressed by the heating implement (heat source) 17 while being kept heated. Thereby, the projective electrodes 12 are pushed on to the conduction wires (or conduction pads) 14 to be deformed. Under this condition, the semiconductor element 11 and the wiring substrate 15 are continuously heating during a predetermined time. During this time, the pressure by the heating implement 17 is kept constant to make sure the conduction wires (or conduction pads) 14 are deformed to sink into the wiring substrate 15.

Figure 6D:
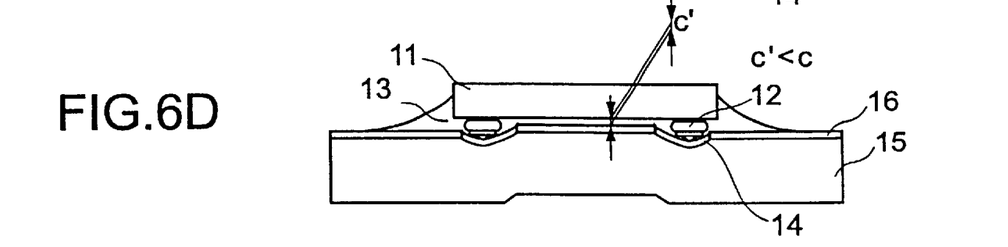

Since the conduction wires (or conduction pads) 14 sink into the wiring substrate 15, a thickness of a part of the insulative resin overlaid on the principal surface 15a within an inner side of the projective electrodes 12 becomes smaller than that of the other part thereof overlaid in an outer side of the projective electrodes 12. Accordingly, strength of adhesions is greater in the inner side of the projective electrodes 12 than in the outer side of the projective electrodes 12. Consequently, when the insulative resin 13 is hardened to shrink in response to heating, a part of the wiring substrate 15 within the inner side of the projective electrodes 12 is lifted, as shown in FIG. 6D. In FIGS. 6B to 6D, a solder resist is referenced by a numeral 16.

In the above case, it is readily caused to occur that the part of the wiring substrate 15 within the inner side of the projective electrodes 12 is lifted, provided that glass transition point of the insulative resin 13 is higher than that of the wiring substrate 15. This is also possible, provided that strength of the wiring substrate 15 is smaller than that of the insulative resin 13 even though glass transition point of the wiring substrate 15 is higher than that of the insulative resin 13.

With the structure and the process mentioned above, a residual stress of the insulative resin 13 still remains around the projective electrodes 12. On the other hand, no or little residual stress of the insulative resin 13 remains within the inner side of the projective electrodes 12, since a part of the insulative resin 13 therewithin can shrink sufficiently.

Referring to FIGS. 6A to 6D continued, description is made as regards some examples of the method of manufacturing the semiconductor device according to the preferred embodiment.

In the Example 1 with reference to FIGS. 6A to 6D, the semiconductor element 11 is made of Si (silicon). The wiring substrate 15 is made of glass epoxy which has a glass transition point of 120° C. and a modulus of bending elasticity of 470 Kgf/mm². The insulative resin 13 is made of acid anhydride epoxy which has a glass transition point of 150° C., a coefficient of linear expansion of 30 ppm/mm/C and a modulus of bending elasticity of 600 Kgf/mm².

With the above composition, a temperature of the heating implement (heat source) 17 is determined to be 180° C. while a temperature of the wiring substrate 15 is determined to be 50° C. By an ordinary (slow) cooling after releasing the heating and the pressure by the heating implement 17 illustrated in FIG. 6A, the insulative (epoxy) resin 13 between the semiconductor element 11 and the wiring substrate 15 starts shrinking from the glass transition point of 120° C. As a glass transition point of the wiring substrate 15 is lower than that of the insulative (epoxy) resin 13, the wiring substrate 15 is pulled by the shrinkage power of the insulative (epoxy) resin 13 in the direction that a thickness "C" of the insulative (epoxy) resin 13 illustrated in FIG. 6C is reduced. Even when the temperature is decreased down to the glass transition point of the wiring substrate 15, the wiring substrate 15 is further deformed. The reason is that the modulus of bending elasticity of the insulative (epoxy) resin 13 is greater than that of the wiring substrate 15. A part of the insulative (epoxy) resin 13 around the central area of the semiconductor element 11 can shrink sufficiently so as not to produce a residual stress. On the contrary, a residual stress is inevitably caused to occur in a part of the insulative (epoxy) resin 13 around the projective electrodes 12, due to a difference of shrinkage between the insulative (epoxy) resin 13 and the projective electrodes 12 as well as the conduction wires (or conduction pads) 14. In this Example 1, a distribution of the residual stress becomes similar to that shown in FIG. 4.

In the Example 2, with reference to FIGS. 6A to 6D, the semiconductor element 11 is made of Si (silicon). The wiring substrate 15 is made of polyimide which has a glass transition point of 300° C. and a modulus of bending elasticity of 610 Kgf/mm². The insulative resin 13 is made of acid anhydride epoxy which has a glass transition point of 150° C., a coefficient of linear expansion of 30 ppm/mm/°C and a modulus of bending elasticity of 760 Kgf/mm².

With the above composition, a temperature of the heating implement (heat source) 17 is determined to be 200° C. while a temperature of the wiring substrate 15 is determined to be 80° C. By an ordinary (slow) cooling, after releasing the heating and the pressure by the heating implement 17 illustrated in FIG. 6A, the insulative (epoxy) resin 13 between the semiconductor element 11 and the wiring substrate 15 starts shrinking from the glass transition point of 150° C. As the modulus of bending elasticity of the wiring substrate 15 is lower than that of the insulative (epoxy) resin 13 the wiring substrate 15 is pulled by shrinkage power of the insulative (epoxy) resin 13 in the direction that a thickness "C" of the insulative (epoxy) resin 13 illustrated in FIG. 6C is reduced. A part of the insulative (epoxy) resin 13 around the central area of the semiconductor element 11 can shrink sufficiently so as not to produce a residual stress. On the contrary, a residual stress in inevitably caused to occur in a part of the insulative (epoxy) resin 13 around the projective electrodes 12, due to a difference of shrinkage between the insulative (epoxy) resin 13 and the projective electrodes 12 as well as the conduction wires (or conduction pads) 14. In this Example 2, a distribution of the residual stress also becomes similar to that shown in FIG. 4.

In the Example 3, with reference to FIGS. 7A to 7D, the semiconductor element 21 is made of Si (silicon). The wiring substrate 25 is made of a flex board (in the flex board, a part of the wiring substrate 25 outside the projective electrode and corresponding conduction wires comprises multiple layers while another part of the wiring substrate 25 inside thereof comprises one or more layers fewer than the number of the multiple layers of the wiring substrate 25 outside therefrom, accordingly the wiring substrate 25 has a thin portion 25a, as illustrated in FIGS. 7A to 7D). The insulative resin 23 is made of acid anhydride epoxy which has a glass transition point of 150° C., a coefficient of linear expansion of 30 ppm/mm/°C. and a modulus of bending elasticity of 760 Kgf/mm².

Figure 7A:
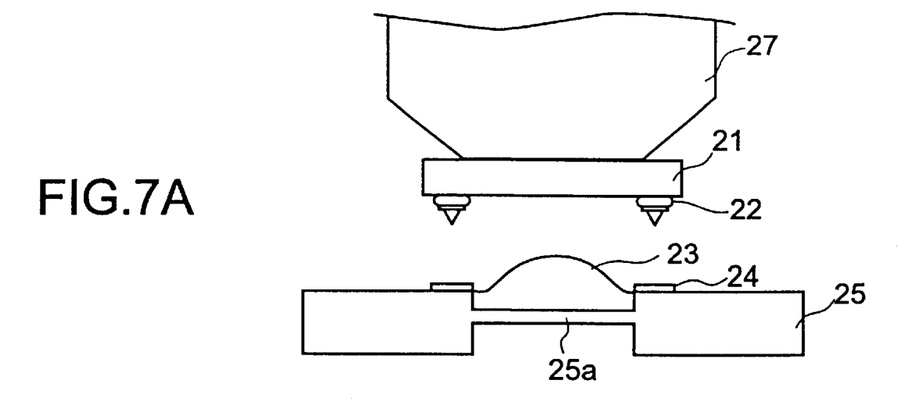
FIGS. 7A to 7D are schematic side views for showing a third example of the method of manufacturing a semiconductor device according to the preferred embodiment of the present invention with various manufacturing steps.
Figure 7B:
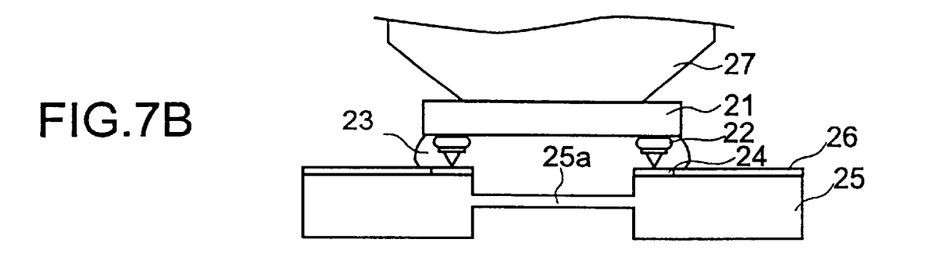
Figure 7C:
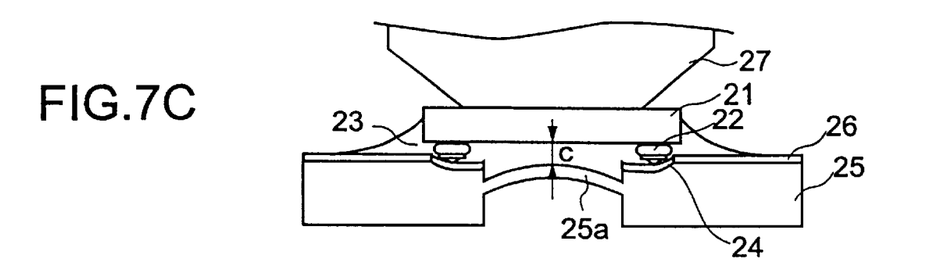
Figure 7D:
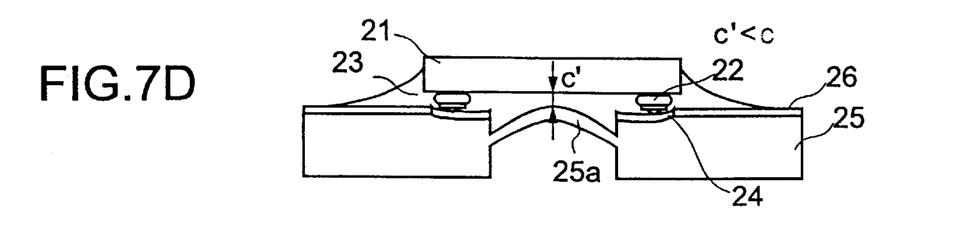

With the above composition, a temperature of the heating implement (heat source) 27 is determined to be 200° C. while a temperature of the wiring substrate 25 is determined to be 80° C. By an ordinary (slow) cooling after releasing the heating and the pressure by the heating implement 27 illustrated in FIG. 7A, the insulative (epoxy) resin 23 between the semiconductor element 21 and the wiring substrate 25 starts shrinking from the glass transition point of 150° C. As the thin portion 25a has a flexibility, the thin portion 25a is pulled by shrinkage power of the insulative (epoxy) resin 23 is reduced, as illustrated in FIGS. 7C and 7D. A part of the insulative (epoxy) resin 23 around the central area of the semiconductor element 21 can shrink sufficiently so as not to produce a residual stress. On the contrary, a residual stress in inevitably caused to occur in a part of the insulative (epoxy) resin 23 around the projective electrodes 22, due to a difference of shrinkage between the insulative (epoxy) resin 23 and the projective electrodes 22 as well as the conduction wires (or conduction pads) 24. In this Example 3, a distribution of the residual stress also becomes similar to that shown in FIG. 4. A solder resist is referenced by a numeral 26 in FIGS. 7A to 7D.

As described above, conventionally, a connection between projective electrodes and conduction wires is achieved only by pressing the projective electrodes to the conduction wires. The connection is supported by a residual stress generated in the insulative resin around the projective electrodes and the corresponding conduction wires. The residual stress is generated, because a shrinkage of the insulative resin is larger than a thermal shrinkage of the projective electrodes and the conduction wires. In the conventional art, total thermal stress of the insulative resin decreases the residual stress to cause a defective connection. According to the preferred embodiment of the present invention, it takes longer than the conventional art to decrease the residual stress by reducing the total thermal stress. Thus, connection reliability for a long time is improved in the present invention compared with the conventional art.

Furthermore, according to the present invention, the method of manufacturing a semiconductor device includes a step in which the projective electrodes are pushed to the conduction wires so that the projective electrodes are deformed and that the conduction wires shrink into the wiring substrate. As a result, a distribution of the residual stress of the insulative resin is readily rendered to a desirable one without carrying out an additional step.

While the present invention has thus far been described in conjunction with only a preferred embodiment and three examples thereof, it will now be readily possible for one skilled in the art to put the present invention into effect in various other manners.

What is claimed is:

1. A semiconductor device comprising:
   a substrate which has a primary surface;
   a conduction wire formed on said primary surface;
   a semiconductor element which has a secondary surface;
   a projective electrode formed on said secondary surface;
   an insulative resin for adhesion which is applied so as to be uniformly distributed between said primary surface and said secondary surface between said projective electrode, and which shrinks by hardening thereof;
   said substrate and said semiconductor element being adhered to each other by the hardening of said insulative resin with said projective electrode and said conduction wire corresponding with each other, so that an electrical connection between said projective electrode and said conduction wire is achieved and that a residual stress is generated in said insulative resin; and
   said residual stress having a maximum value thereof about said projective electrode,
      wherein a primary portion of said substrate, inside of said conduction wire corresponding to said projective electrode, is thinner than a secondary portion of said substrate, outside of said conduction wire corresponding to said projective electrode.

2. The semiconductor device of claim 1, said residual stress further having a minimum value thereof around a central portion of said semiconductor element, wherein said electrical connection is kept by a tensile power based on said residual stress around said projective electrode.

3. The semiconductor device of claim 2, wherein said minimum value is null.

4. The semiconductor device of claim 1, wherein said substrate is an organic substrate.

5. The semiconductor device of claim 1, wherein said insulative resin for adhesion is a heat-hardened type.

6. The semiconductor device of claim 1, wherein the insulative resin is applied so as to occupy an entire space between said primary surface and said secondary surface.

7. The semiconductor device of claim 1, wherein the insulative resin has a single modulus of elasticity.

8. A semiconductor device comprising:
   a substrate which has a primary surface;
   a conduction wire formed on said primary surface;
   a semiconductor element which has a secondary surface;
   a projective electrode formed on said secondary surface;
   an insulative resin for adhesion which is applied between said primary surface and said secondary surface, and which shrinks by hardening thereof;
   said substrate and said semiconductor element being adhered to each other by the hardening of said insulative resin with said projective electrode and said conduction wire corresponding with each other, so that an electrical connection between said projective electrode and said conduction wire is achieved and that a residual stress is generated in said insulative resin; and
   said residual stress having a maximum value thereof about said projective electrode,
      wherein a primary portion of said substrate, inside of said conduction wire corresponding to said projective electrode, is thinner than a secondary portion of said substrate, outside of said conduction wire corresponding to said projective electrode, said secondary [part] portion comprises multiple layers while said primary portion comprises at least one layer fewer than said multiple layers of said secondary part, so that said substrate has flexibility.

* * * * *